(12) United States Patent
Roth et al.

(10) Patent No.: US 10,928,241 B2
(45) Date of Patent: Feb. 23, 2021

(54) ULTRASOUND SENSOR

(71) Applicant: Continental Automotive GmbH, Hannover (DE)

(72) Inventors: Manfred Roth, Großhabersdorf (DE); Karl-Friedrich Pfeiffer, Erlangen (DE); Peter Konopka, Cierne (SK); Frantisek Mezulian, Havirov-Podlesi (CZ); Pavel Sofer, Hlučín (CZ)

(73) Assignee: VITESCO TECHNOLOGIES GMBH, Hanover (DE)

( * ) Notice: Subject to any disclaimer, the term of this patent is extended or adjusted under 35 U.S.C. 154(b) by 99 days.

(21) Appl. No.: 16/089,911

(22) PCT Filed: Mar. 14, 2017

(86) PCT No.: PCT/EP2017/055991
§ 371 (c)(1),
(2) Date: Sep. 28, 2018

(87) PCT Pub. No.: WO2017/167574
PCT Pub. Date: Oct. 5, 2017

(65) Prior Publication Data
US 2019/0113379 A1     Apr. 18, 2019

(30) Foreign Application Priority Data
Mar. 30, 2016   (DE) ..................... 10 2016 205 240.3

(51) Int. Cl.
| | | |
|---|---|---|
| *G01F 23/296* | (2006.01) | |
| *F01M 11/12* | (2006.01) | |
| *H01L 41/25* | (2013.01) | |

(52) U.S. Cl.
CPC ......... *G01F 23/2968* (2013.01); *F01M 11/12* (2013.01); *H01L 41/25* (2013.01)

(58) Field of Classification Search
CPC .... G01F 23/2968; G01F 23/00; G01F 23/246; G01F 23/30; G01N 29/022; G01N 30/00;
(Continued)

(56) References Cited

U.S. PATENT DOCUMENTS

| | | | |
|---|---|---|---|
| 6,098,459 A | 8/2000 | Bauer | ............................ 73/431 |
| 2006/0019551 A1* | 1/2006 | Jamnia | .............. B29C 45/14639 439/736 |

(Continued)

FOREIGN PATENT DOCUMENTS

| | | | | |
|---|---|---|---|---|
| DE | 197 17 348 A1 | 10/1998 | ............. | B60R 16/02 |
| DE | 10 2005 012 041 A1 | 9/2006 | ............. | G01F 23/04 |

(Continued)

OTHER PUBLICATIONS

German Office Action, Application No. 10 2016 205 240.3, 6 pages, dated Jan. 19, 2017.
(Continued)

*Primary Examiner* — Lisa M Caputo
*Assistant Examiner* — Nigel H Plumb
(74) *Attorney, Agent, or Firm* — Slayden Grubert Beard PLLC

(57) ABSTRACT

Various embodiments may include a method for producing an ultrasound sensor to detect the filling level and/or the temperature of a fluid in an internal combustion engine comprising: arranging an electronics system of the ultrasound sensor in an injection molding die; and encapsulating the electronics system by injection molding with a thermoplastic material and thereby forming a housing for the electronics system; and removing the encapsulated electronics system from the injection molding die. The housing includes a functional section to fulfill a predetermined function.

9 Claims, 2 Drawing Sheets

(58) Field of Classification Search
CPC .......... G01N 11/12; G01N 2011/0013; G01N 2011/002; G01N 2011/0093; G01N 2035/00306; B01D 53/025; B01D 53/462; G01H 3/005; G01L 11/06; G01D 11/24; G01D 11/245; G04D 7/1207; F01M 11/12; H01L 41/25
See application file for complete search history.

(56) References Cited

U.S. PATENT DOCUMENTS

| | | |
|---|---|---|
| 2010/0186500 A1 | 7/2010 | Reimer et al. .............. 73/290 V |
| 2014/0352426 A1 | 12/2014 | Kuehnel et al. ............ 73/290 V |
| 2016/0041024 A1 | 2/2016 | Reimer et al. .............. 73/290 V |

FOREIGN PATENT DOCUMENTS

| | | | | |
|---|---|---|---|---|
| DE | 10 2007 059 584 A1 | 6/2009 | .......... | G01F 23/296 |
| DE | 10 2008 017 183 A1 | 10/2009 | ............ | F01M 11/12 |
| DE | 10 2009 046 143 A1 | 5/2011 | ............... | G01F 1/66 |
| DE | 10 2010 061 752 A1 | 5/2012 | ............ | G01D 11/24 |
| DE | 10 2013 202 212 A1 | 8/2013 | ............... | B81B 7/02 |
| DE | 10 2012 014 307 A1 | 1/2014 | ............... | G01C 9/20 |
| EP | 0 853 236 A1 | 7/1998 | .......... | G01F 23/296 |
| WO | 2013/102581 A1 | 7/2013 | .......... | G01F 23/296 |
| WO | 2017/167574 A1 | 10/2017 | .......... | G01F 23/296 |

OTHER PUBLICATIONS

International Search Report and Written Opinion, Application No. PCT/EP2017/055991, 22 pages, dated Jul. 12, 2017.
Chinese Office Action, Application No. 201780020421.2, 7 pages, dated Sep. 25, 2019.

* cited by examiner

ULTRASOUND SENSOR

CROSS-REFERENCE TO RELATED APPLICATIONS

This application is a U.S. National Stage Application of International Application No. PCT/EP2017/055991 filed Mar. 14, 2017, which designates the United States of America, and claims priority to DE Application No. 10 2016 205 240.3 filed Mar. 30, 2016, the contents of which are hereby incorporated by reference in their entirety.

TECHNICAL FIELD

The present disclosure relates to sensors. Various embodiments may include a method for producing an ultrasound sensor and/or an ultrasound sensor, in particular to a method for producing an ultrasound sensor for detecting the filling level and/or the temperature of a fluid which is used in an internal combustion engine, such as an engine oil for example.

BACKGROUND

Ultrasound sensors may be used, for example, to detect the filling level and/or the temperature of an oil within an oil sump of an internal combustion engine. In this case, for the purpose of detecting the filling level, ultrasound waves are emitted by the ultrasound sensor and the filling level is ascertained on the basis of the sound waves which are reflected at the oil surface and the propagation time of said sound waves. To this end, an ultrasound sensor may include an ultrasound transceiver.

The electronics system of the ultrasound transducer comprises, for example, a piezo element and an integrated circuit, for example an ASIC. The system is usually arranged in a hollow housing after the electrical connection process and fixed there in a stationary manner, for example by means of an adhesive. In other systems, it may be placed in a stationary manner within the housing in some other way by means of a suitable device, for example by clipping.

For example, DE 10 2012 014 307 A1 discloses a method and a sensor apparatus for detecting a liquid level for a vehicle. The sensor device disclosed in said document comprises a liquid level sensor and a position sensor. The liquid level sensor and the position sensor are arranged in the sensor device in such a way that the liquid level sensor and the position sensor are in a defined spatial relationship, so that a position which is detected by the position sensor also determines the position of the liquid level sensor. The sensor device is designed in order to take into account the spatial relationship when detecting the liquid level.

SUMMARY

The teachings of the present disclosure may be embodied in a sensor with improved production costs and measurement quality and which is also robust in respect of service life. For example, some embodiments may include a method for producing an ultrasound sensor (10) which is designed to detect the filling level and/or the temperature of a fluid in an internal combustion engine, wherein the method comprises: providing an electronics system (20) of the ultrasound sensor (10), arranging the electronics system (20) of the ultrasound sensor (10) in an injection molding die, and encapsulating the electronics system (20) by injection molding with plastic for the purpose of forming a housing (30) for the electronics system (20), wherein the housing (30) has at least one functional section (32, 34, 36) which is designed to fulfill a predetermined function.

In some embodiments, the plastic is a thermosetting or a thermoplastic material which is resistant to the fluid.

In some embodiments, the at least one functional section has a seal recess (32) which is arranged on an outer side of the housing (30) and is designed to receive at least one seal.

In some embodiments, the at least one functional section has at least one fastening region (34) to which separate elements can be fastened.

In some embodiments, the fastening region is at least one projection (34) to which a sound carrying tube can be fastened.

In some embodiments, the at least one functional section has a sensor recess (36) in which a sensor (37) can be inserted.

In some embodiments, providing the electronics system (20) of the ultrasound sensor (10) comprises: providing a carrier element (22); fitting at least one piezo element (24) to the carrier element (22), fitting an integrated circuit (26) to the carrier element (22), and electrically connecting the piezo element (24) and the integrated circuit (26) to conductors which are arranged on the carrier element (22).

As another example, some embodiments include an ultrasound sensor (10) for detecting the filling level and/or the temperature of a fluid in an internal combustion engine, wherein the ultrasound sensor (10) has: an electronics system (20) and a housing (30) which surrounds the electronics system (20) and is formed from plastic and is produced by means of an injection molding process, wherein the housing (30) has at least one functional section (32, 34, 36) which is designed to fulfill a predetermined function.

In some embodiments, the plastic is a thermosetting or a thermoplastic material which is resistant to the fluid.

In some embodiments, the at least one functional section has: a seal recess (32) which is arranged on an outer side of the housing (30) and is designed to receive at least one seal, and/or a fastening region (34) to which separate elements can be fastened, and/or a sensor recess (36) in which a sensor (37) can be inserted.

BRIEF DESCRIPTION OF THE DRAWINGS

Further features are discussed below in view of the appended drawings, in which.

DETAILED DESCRIPTION

Figure 1:
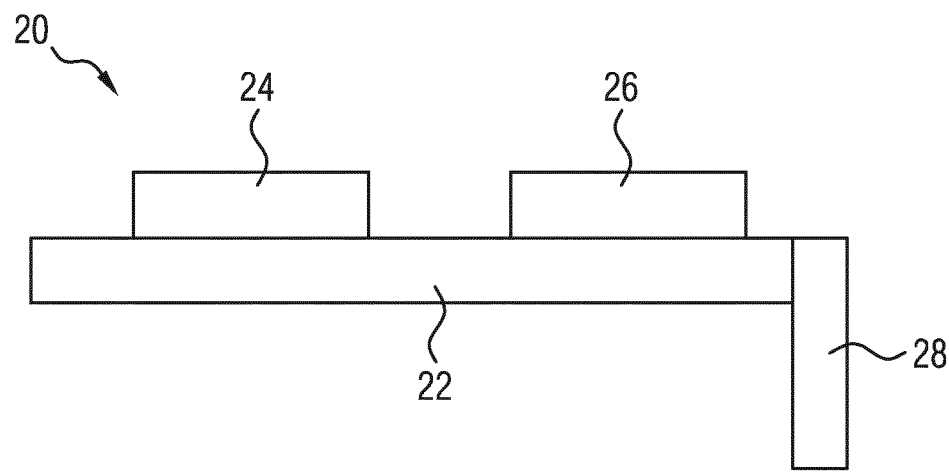
FIG. 1 shows an electronics system of an ultrasound sensor incorporating teachings of the present disclosure.

The embodiments of the present disclosure may include arranging an electronics system of the ultrasound sensor in an injection mold and encapsulating said electronics system by injection molding in such a way that a housing is formed for the electronics system, wherein further functional sections can be integrally formed on the housing during the injection molding process. These functional sections include, for example, receiving slots for seals, projections for fitting external elements, and further recesses for receiving external elements, such as sensors for example.

Some embodiments may include a method for producing an ultrasound sensor, which ultrasound sensor is designed to detect the filling level and/or the temperature of a fluid which is used in an internal combustion engine. Some embodiments may include providing an electronics system of the ultrasound sensor, arranging the electronics system of the ultrasound sensor in an injection molding die, and encapsulating the electronics system by injection molding with plastic for the purpose of forming a housing for the electronics system, wherein the housing has at least one functional section which is designed to fulfill a predetermined function.

In this case, the predetermined function may be a function which is not directly associated with the function of the ultrasound sensor. That is to say that the predetermined function is, for example, not associated with transmitting and receiving the ultrasound waves and/or with the electrical connection of the sensor.

In some embodiments, the electronics system is encapsulated by injection molding with a thermosetting or thermoplastic material. In some embodiments, the plastic material is designed to withstand the conditions in the environment in which the ultrasound sensor is used. For example, the plastic material is selected in such a way that it is resistant to engine oil or to a urea solution for SCR catalysts. In addition, the plastic material is provided in such a way that no damage is sustained by the electronics system when it is encapsulated by injection molding.

In some embodiments, the at least one functional section has a seal recess which is designed to receive at least one seal. In particular embodiments, the seal recess is a circumferential groove in which a seal is inserted. This seal can be designed, after the ultrasound sensor is arranged within a fluid container (for example an oil sump or a urea tank) of the internal combustion engine, to produce a seal in relation to the fluid container so that no fluid can escape from the container.

In some embodiments, the at least one functional section has a sensor recess in which a sensor can be inserted. For example, the sensor recess may be a substantially cylindrical recess in which, for example, a temperature sensor for detecting the temperature of the fluid can be arranged.

In some embodiments, the at least one functional section has a fastening region to which separate elements can be fastened. The fastening region can be formed, for example, in the form of at least one projection to which, for example, a sound carrying tube can be fastened, for example by means of adhesive bonding, welding and/or by means of hot-shaping or -calking of a sound carrying tube which is formed from thermoplastic material. In some embodiments, the separate elements can also be fitted in a detachable manner to the fastening region by means of a mechanical connection, for example by means of clipping.

In some embodiments, the electronics system of the ultrasound sensor includes a piezo element which is fitted to a carrier element. The electronics system further has an integrated circuit (for example a so-called ASIC) which is fitted to the carrier element and is electrically connected to the piezo element by means of conductor tracks which are arranged on the carrier element. The carrier element is, for example, a printed circuit board, a ceramic substrate, a metal leadframe. The electronics system can also have further additional electronic components, such as, for example, active and passive components of the sensor electronics system, in particular relays, diodes, capacitors and further electronic components which are known from the prior art.

In some embodiments, after the entire electronics system is complete, it is arranged in the injection mold and encapsulated by injection molding by means of the injection molding process in such a way that the housing, including the at least one functional section, is formed.

Some embodiments include an ultrasound sensor for detecting the filling level and/or the temperature of a fluid in an internal combustion engine. In some embodiments, the ultrasound sensor has an electronics system and a housing which surrounds the electronics system and is formed from plastic material and is produced by means of an injection molding process. The housing comprises at least one functional section which is designed to fulfill a predetermined function. The predetermined function is a function which is not directly associated with the functions of the ultrasound sensor.

In some embodiments, the ultrasound sensor can be arranged, for example, in an oil sump of the internal combustion engine in order to detect the oil level and/or the oil temperature. In some embodiments, the ultrasound transducer can be used in a urea tank of the internal combustion engine in order to detect the filling level and/or the temperature of the urea solution which is kept for an SCR catalyst.

Figure 2:
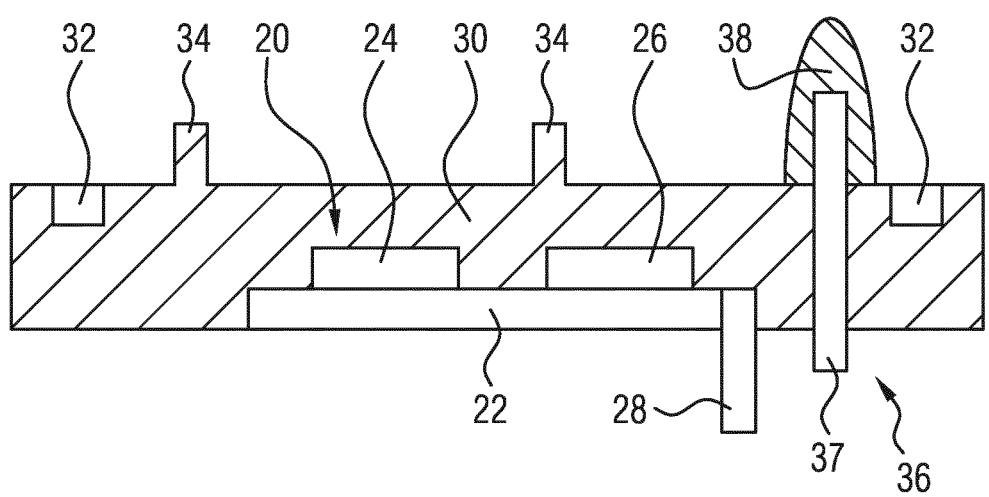
FIG. 2 shows a sectional view through an ultrasound sensor which is produced by means of the method incorporating teachings of the present disclosure.

FIG. 1 shows a schematic view of an exemplary electronics system 20 of an ultrasound sensor 10 (see FIG. 2). The electronics system 20 has a carrier element 22 which, in the example illustrated in the drawings, is a ceramic substrate body and to which a piezo element 24, as ultrasound transceiver, and an integrated circuit 25, for example an ASIC, are fitted. The piezo element 24 is electrically connected to the integrated circuit 26 by means of at least one conductor track (not explicitly illustrated in the drawings) which is fitted on the ceramic substrate body. Furthermore, an electrical connecting conductor 28 on the ceramic substrate body 22 is designed to supply electrical energy to the piezo element 24 and the integrated circuit 26 and to conduct signals from said piezo element and integrated circuit to, for example, an engine controller. Further electronic components (not explicitly illustrated), such as, for example, diodes, capacitors, electrical conductors, relays and further electronic components, can be arranged on the ceramic substrate body 22.

In order to produce the ultrasound transducer 10, the electronics system 20 of FIG. 1 can be arranged in a predetermined position in an injection mold (not explicitly illustrated) and sheathed with a plastic material by means of an injection molding process for the purpose of forming a housing 30 (see FIG. 2).

FIG. 2 shows a schematic sectional view through an ultrasound sensor 10 incorporating teachings of the present disclosure. As shown, the electronics system 20 is already encapsulated by injection molding by a plastic injection molding and therefore arranged within a housing 30. The housing 30 has a plurality of functional sections 32, 34 and 36 which are designed to fulfill predetermined functions which are not directly associated with the function of the ultrasound sensor. These predetermined functions are, for example, receiving a seal (not explicitly illustrated), fastening further external elements, such as a sound carrying tube for example, or receiving further external elements, such as a temperature sensor for example.

As illustrated in FIG. 2, the at least one functional section has a seal recess 32 which is formed as a circumferential groove in the housing 30. The seal recess 32 is designed to receive a seal (not shown). The seal which is inserted into the seal recess 32 is designed to form a seal between the housing and, for example, the oil sump when the ultrasound sensor 10 is located within the oil sump in an installed state.

The at least one functional section can further have at least one fastening region 34 which, according to the refinement of FIG. 2, is formed in the form of two projections. A sound carrying tube for example can be fastened to this fastening region 34, in particular by means of adhesive bonding, welding, clipping and/or hot-calking.

In some embodiments, the housing 30 includes a functional section with a sensor recess 36 in which, for example, a temperature sensor 37 for detecting the temperature of the engine oil can be arranged. To this end, the housing 30 can further have a projection 38 into which the sensor recess 36 at least partially protrudes (see FIG. 2).

Figure 3:
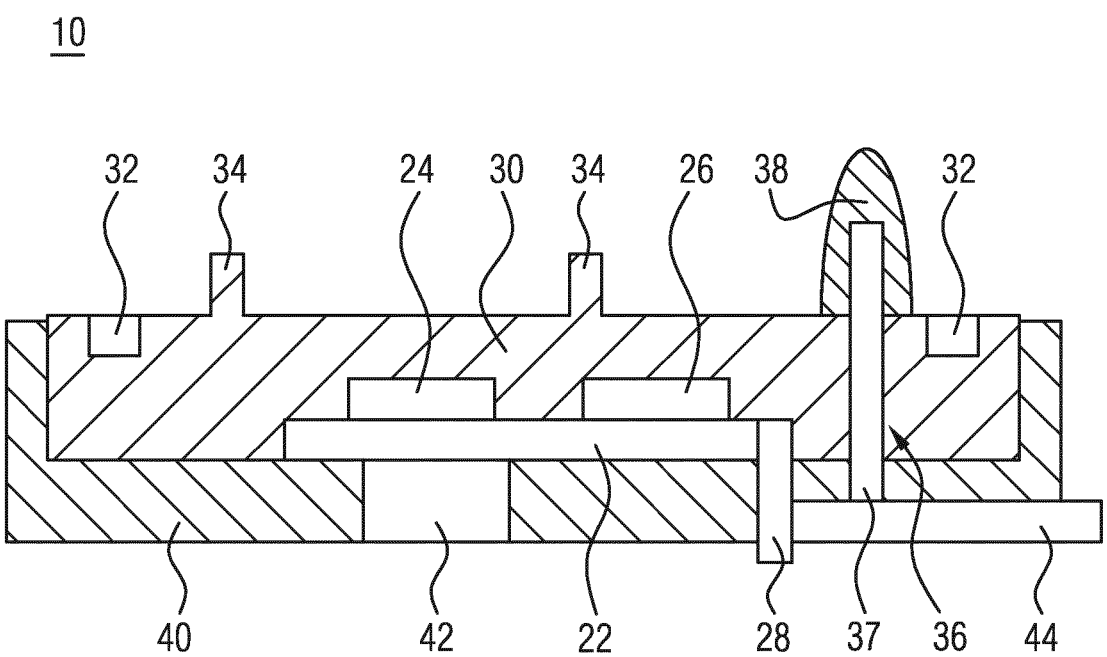
FIG. 3 shows the ultrasound sensor of FIG. 2 installed in an oil sump.

The ultrasound sensor 10 of FIG. 2 is shown in a partially installed state with reference to FIG. 3. FIG. 3 shows that the ultrasound sensor 10 is fastened to a holder 40 which, in turn, can be arranged within an oil sump and can be fastened to the oil sump. The holder 40 has a damping element 42 which is designed to mechanically damp the vibrations of the piezo element 24. This can improve the measurement accuracy and the measurement range of the ultrasound sensor 10.

In some embodiments, a further electrical connecting conductor 44 is located on the holder 40, which electrical connecting conductor is electrically connected to the connecting conductor 28 of the electronics system 20 and is designed to convey current signals and sensor signals between the electronics system 20 and an engine controller (not explicitly illustrated).

The invention claimed is:

1. A method for producing an ultrasound sensor to detect the filling level and/or the temperature of a fluid in an internal combustion engine, the method comprising:

arranging an electronics system of the ultrasound sensor in an injection molding die;

encapsulating the electronics system by injection molding with a thermoplastic material and thereby forming a housing for the electronics system; and removing the encapsulated electronics system from the injection molding die;

wherein the housing includes a functional section to fulfill a predetermined function.

2. The method as claimed in claim 1, wherein the thermoplastic material is resistant to the fluid.

3. The method as claimed in claim 1, wherein:

the functional section includes a seal recess arranged on an outer side of the housing; and the seal recess is configured to receive a seal.

4. The method as claimed in claim 1, wherein the fastening region comprises a projection configured to support a sound carrying tube.

5. The method as claimed in claim 1, wherein the functional section includes a sensor recess configured to receive a sensor.

6. The method as claimed in claim 1, wherein the electronics system comprises:

a carrier element;

a piezo element fitted to the carrier element; and an integrated circuit fitted to the carrier element.

7. An ultrasound sensor for detecting the filling level and/or the temperature of a fluid in an internal combustion engine, the sensor comprising:

an electronics system; and a housing surrounding the electronics system;

wherein the housing comprises an injection molded thermoplastic material;

the housing includes a functional section configured to fulfill a predetermined function.

8. The ultrasound sensor as claimed in claim 7, wherein the functional section comprises a seal recess arranged on an outer side of the housing to receive at least one seal.

9. The ultrasound sensor as claimed in claim 7, wherein the functional section comprises a sensor.

* * * * *